VARIABLE ATTENUATION CIRCUIT

Filed March 3, 1966

INVENTOR
ANDREW C. M. CHAO

BY Wilson, Robbins & Anderson
ATTORNEYS

United States Patent Office 3,412,340
Patented Nov. 19, 1968

1 2

3,412,340

VARIABLE ATTENUATION CIRCUIT

Andrew C. M. Chao, Monterey Park, Calif., assignor to The Bendix Corporation, a corporation of Delaware Filed Mar. 3, 1966, Ser. No. 531,626
6 Claims. (Cl. 330—29)

ABSTRACT OF THE DISCLOSURE

A circuit is disclosed for variously alternating an input signal in accordance with a control signal. A substantially-linear amplifier (operational amplifier) is controlled to accept varying electrical currents, thereby attenuating an input signal, in accordance with a controlled variable-resistance element. The resistance-element is coupled to be controlled both by a control signal and the input signal and to thereby control the quantity of electrical current accepted by the substantially-linear amplifier.

The present invention relates to an attenuating circuit, and more specifically to a variable electronic circuit for attenuating an electrical signal, for example in accordance with a control signal, as for use in cooperation with an amplifier to provide an automatic gain control system.

A widespread need exists in various fields of electronics for variable attenuator circuits. Specifically, for example, these circuits are widely employed in automatic gain control systems, amplitude modulators, and remote control circuits. In the past, variable attentuator systems have usually included a variable resistance element employed for example to shunt a portion of the signal undergoing attenuation. Several different forms of variable resistance elements have been utilized in this application, including transistors and diodes which may be operated over a limited, linear portion of their characteristic curves. In general, such attenuator circuits utilizing a shunting variable resistance element have been very satisfactory in many applications; however, these circiuts are effective only at low operating levels. That is, the inherent non-linearity of semi-conductor variable resistance elements confines effective operation of such systems to a range of low-level signals. Of course, the need often arises for a variable attenuator system capable of processing signals at an elevated operating level. To satisfy that need, one technique that has been employed in the past involves reducing the signal to a low level, applying variable attenuation as desired, then restoring the signal to a high level by succeeding amplifier stages. The techniques results in complex and expensive apparatus, degradation of signal-to-noise ratio and decreased dynamic range; therefore, it is rather unsatisfactory.

Other variable attenuator systems proposed for high level operation have included various elements as, transistors with peculiar characteristics, magnetic amplifiers, and Hall-effect devices. Such systems have generally fallen short of total desirability. For example, mechanizations incorporating these elements have variously lacked stability, reliability, or the facility of compact packaging as in micro-miniaturization. Therefore, a need continues for an effective variable attenuator system which avoids these and other disadvantages of prior-art systems.

An object of the present invention is to provide an improved variable attenuator circuit affording substantially linear operation over a wide amplitude range of the signal undergoing attenuation.

Another object of the present invention is to provide an improved variable attenuator system which is reliable, economical, and effective and which may be manufactured in a compact form as by micro-miniaturization techniques.

Still another object of the present invention is to provide a variable attenuator circuit capable of operation at high signal levels, which does not degrade the attenuated signal to any substantial degree, and which may be economically manufactured in a compact form.

A further object of the present invention is to provide an improved variable attenuator system, using non-inductive elements and capable of operation at high signal levels to exercise substantially-linear attenuation.

Still a further object of the present invention is to provide an improved automatic gain control system capable of operating at high signal levels which system may be economically manufactured and compactly packaged.

One further object of the present invention is to provide an improved, controlled attenuation circuit employing a substantially-linear amplifier to shunt a portion of the signal in process so as to accomplish attenuation; such amplifier being controlled by a variable resistance element (low level) and feedback means.

Other objects and advantages of the present invention will be apparent to those skilled in the art from a consideration of the following along with the appended drawings, wherein.

Figures 1, 2, 3A:
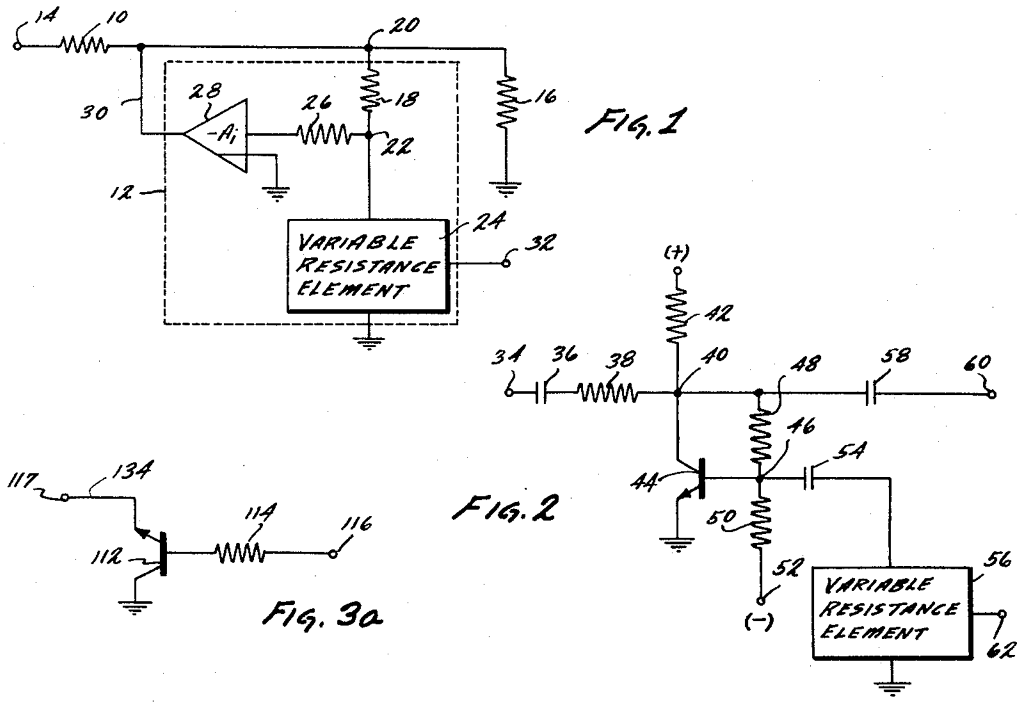
FIGURE 1 is a diagrammatic representation illustrative of a basic form of the system of the present invention.
FIGURE 2 is a diagrammatic representation of a simple form of the present invention.
FIGURE 3*a* is a diagrammatic representation of an alternate form of a portion of the embodiment of FIGURE 3.

Referring initially to FIGURE 1, a circuit in accordance with the present invention is represented as an L attentuator including a series resistor 10 and a shunt resistance as represented by the elements within a block 12. The input signal applied at a terminal 14 is thus attenuated variously in accordance with variable control of the elements within the block 12, then applied to a load resistor 16, which is referenced to ground potential.

Considering the elements of the block 12 in greater detail, a feedback resistor 18 is connected from a junction point 20 (between resistors 10 and 16) to a terminal point 22 which is in turn connected through a variable resistance element 24 to a source of reference or ground potential. The terminal point 22 is also connected through a resistor 26 to the input of a substantially-linear amplifier 28 having a negative gain, the output of which is returned to the junction point 20 through a conductor 30. The amplifier 28 is a fixed-gain current amplifier which may take a wide variety of different forms, for example, it may comprise various operational amplifiers as well known in the prior art, having a relatively low input impedance, a relatively high output impedance and a relatively high gain. The input impedance of the current amplifier may be considered as a part or entirely represented by the resistor 26 and the output impedance similarly represented by the load resistor 16. A multitude of different amplifier structures with the desired linear operating characteristics over a broad range of input signals are well known and may be employed herein.

Considering the operation of the system as represented in FIGURE 1, assume the application to the terminal 14 of the signal that is to be variously attenuated in accordance with a control signal. Assuming the resistance of the resistor 18 is quite high relative to the load resistance of the resistor 16, the division of the input signal will be essentially between the conductor 30 and the load resistor 16. Therefore, the degree to which the signal applied to the load resistor 16 is attenuated, depends upon the portion of the signal flowing through the conductor 30, which in turn depends upon the signal applied to the amplifier 28. Control of the amplifier 28 is accomplished in accordance with the level of the signal at the junction point 20 and the control signal applied at a terminal 32 to establish the resistance of the variable resistance element 24. That is, the resistor 26 and the variable resistance element 24 form a current divider controlling the portion of the signal current through the resistor 18 that is to be applied to the input terminals of the amplifier 28 to establish the current level in conductor 30. Therefore, the amplifier control signal developed at the terminal point 22 varies in accordance with both the signal level at the junction point 20 and the input control signal applied at the terminal 32. If the resistance value of element 24 were zero, the signal level at the junction point 20 would be essentially that portion of the voltage level at junction point 14 determined by the voltage divider of the resistors 10 and 16. If the resistance value of the element 24 were infinite, the voltage level at the terminal point 20 would be substantially zero for large current gain in amplifier 28. The total variations of the system gain at these two extreme values of the variable resistance element constitutes the maximum controllable gain range. Since the amplifier 28 is current-controlled, the resistor 18 may be made very large compared to the equivalent resistance value of the element 24 in parallel with resistor 26 thus allowing the element 24 to operate at a much reduced signal level from that at terminal point 20. For a given type of variable resistance element, the resistance value of the resistor 18 may be chosen to allow the element 24 to operate in an optimum low level region within which it exhibits linear, substantially distortion-free characteristics. The resistor 26 may in turn be chosen to maximize the controllable gain range of the system which approaches a theoretical maximum value approximately equal to the current gain of the amplifier 28.

Further consideration of the system of FIGURE 1 will now assume certain signal variations and the effects of such variations. Initially, assume for example that the input control signal applied at the terminal 32 increases to reduce the equivalent resistance of the variable resistance element 24. As a result, the voltage at the terminal point 22 drops providing a diminished signal through the resistor 26 to the amplifier 28. Therefore, the controlled current through the amplifier 28 accepted from the conductor 30 is reduced forcing increased current to flow through the load resistor 16 thereby effectively reducing the attenuation (increasing the amplitude) of the signal being processed in response to a command by the input control signal.

The increased signal level at the junction point 20 accomplished as explained above (or resulting from variations in the signal level applied at the terminal 14) provides feedback to the amplifier 28 through the resistor 18. Specifically, an increase in the signal level at the junction point 20 results in an increase in the signal level at the terminal point 22 thereby driving the amplifier 28 to accept an increased current effectively reducing the signal at the terminal 20 and attenuating the assumed increase. Thus, the amplifier 28 is controlled somewhat cooperatively by the input control signal applied at the terminal 32 to the variable resistance element 24 and by the level of the signal undergoing attenuation.

In the operation of a system as represented in FIGURE 1, one advantage is that the variable resistance element is allowed to operate at a most favorable signal level. That is, the signal current flowing through element 24 is always a small portion of the total input signal at terminal 14 and decreases with increases in input signal level at terminal 14 in closed loop feedback control applications. In automatic gain control systems, the signal at terminal 20 may be amplified and rectified and then applied to the variable resistance element 24 (input terminal 32) as a feedback input control signal for keeping the signal level at terminal 20 constant. If the input signal level to the system at terminal 14 were maximum, the resistance of element 24 would be minimum to keep the signal level at terminal 20 at some desired, substantially constant level. This allows the variable resistance element to operate at minimum signal level when the input signal level to the system is maximum. And, conversely, the variable resistance element operates at the maximum level only when the input signal level to the system is minimum. Another advantage is that resistor 18 represents a degenerative feedback loop which has the desired maximum effect in the circuit when the resistance of element 24 is maximum or when the amplifier 28 is operating at maximum level. The degenerative feedback loop tends to stabilize the amplifier operation, reduces its inherent distortion and extend its frequency response.

The implementation of the system as represented in FIGURE 1 may be exceedingly simple and one such embodiment is shown in FIGURE 2. The input signal to undergo processing is applied at a terminal 34 which is connected through a capacitor 36 and a series resistor 38 to a junction point 40. The junction point is biased through a resistor 42 that is adapted to be connected to a source of positive potential. The junction point 40 is also connected to the collector electrode of a transistor 44 which serves as a substantially linear amplifier, operating in a base-control mode. The emitter electrode of the transistor 44 is connected to reference potential and the base electrode is connected to a terminal point 46 of a voltage divider consisting of resistors 48 and 50 serially connected between the junction point 40 and a terminal 52 connected to a source of negative potential. The terminal point 46 from which the transistor 44 is controlled is connected through a capacitor 54 to a variable resistance element 56 referenced to ground potential. Output from this system is provided from the junction point 40 through a capacitor 58 to a terminal 60.

It is to be noted that the transistor 44 is biased through the resistors 42 and 50 to operate over a substantially linear portion of its operating characeristic. As a result, the transistor 44 functions as a substantially-linear amplifier with negative gain. The capacitors provided in this system are employed for alternating current coupling and otherwise have essentially no effect in the circuit at frequency of the signals encountered. The variable resistance element 56 may take a variety of forms as previously indicated, two of which are described in detail below.

In the operation of the system of FIGURE 2, a variable signal (amplified control signal) is developed at the terminal point 46 in accordance with the input control signal applied through a terminal 62 to the variable resistance element 56 and in accordance with feedback through the resistor 48. As a result, the transistor 44 functions as a substantially-linear amplified controlled by the variable signal developed at the terminal point 46, to accept a varying amount of current through a controlled path and thereby accomplish controlled attenuation of the signal applied at the terminal 34 for delivery at the output terminal 60. The considerable simplicity of the circuit both in design and mechanization provides great appeal for its use in non-critical applications.

Figure 3:
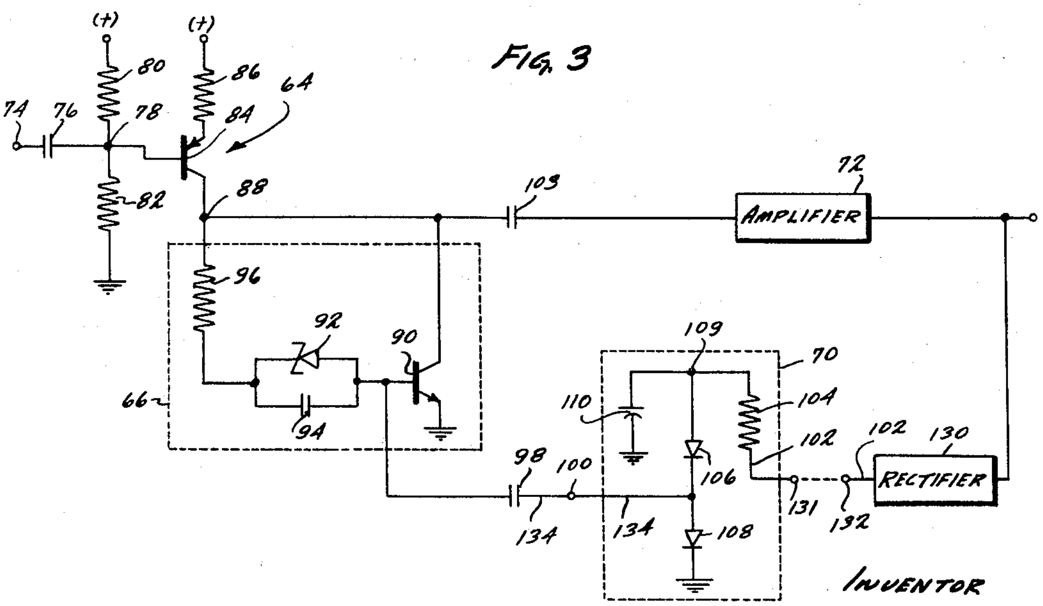
FIGURE 3 is a diagrammatic representation of another embodiment of the present invention.

In variable attenuator systems constructed in accordance with the present invention, it may be shown that to obtain a high range of variable gain the values of the series resistance (resistor 10 FIGURE 1) and the load resistance (resistor 16) should be high in relation to the feedback resistance (resistor 18). This relationship can be accomplished by providing a current stage in the system for supplying bias current to the substantially-linear amplifier, thus serving as a high-impedance signal driver. Such a system is shown in FIGURE 3 and will now be considered in detail. A constant current stage 64 (generally indicated) drives the substantially linear amplifier 66 which is controlled by a diode-type variable resistance element 70. The controlling voltage for the variable resistance element 70 may be provided separately in an open loop system at the terminal 131, or a closed loop automatic gain control system may be mechanized by connecting terminals 131 and the terminal 132, from which the output of the amplifier 72 is received.

A variety of variable resistance elements may be used in this application and a second type is shown in FIGURE 3*a* using an unbiased transistor 112 (either a conventional or a bi-lateral type) which connected to a resistor 114 functions as the variable resistor element with the input control voltage applied at terminal 116. The circuit of FIGURE 3*a* may be substituted for circuit 70 by connecting terminal 117 to terminal 100 and terminal 116 to terminal 131 as an alternate method for implementing the variable resistance element.

Considering the system of FIGURE 3 in greater detail, input signals are applied to the terminal 74 through a coupling capacitor 76 to a junction 78 in a voltage divider including a resistor 80, connected to a source of positive potential, and a ground-referenced resistor 82. The junction 78 therefore provides a fixed direct current bias to the base electrode of a transistor 84 of the stage 64. The emitter electrode of the transistor 84 is connected through a bias resistor 86 to a source of positive potential and the collector electrode is connected to a junction point 88 collector electrode is connected to a junction point 88 from which the substantially-linear amplifier 66 draws signal attenuating current. The controlled current path through the substantially-linear amplifier 66 is from the function point 88 through the collector-emitter path of a transistor 90. The base electrode of the transistor 90 is then connected through a parallel circuit including a Zener-diode 92 and a capacitor 94; and a feedback resistor 96 connected to the junction point 88. The base electrode of the transistor 90 is also connected through a capacitor 98 to the variable resistance element circuit 70. The variable resistance element circuit 70, as indicated, receives an input control signal from the output of the amplifier 72 through the rectifier circuit 130 and conductor 102. That signal is supplied through a resistor 104 to serially-connected diodes 106 and 108 which are ground-referenced. The resistor 104 is also connected through a capacitor 110 to ground to provide both filtering and a low impedance signal return path. The point of interconnection of the diodes 106 and 108 is capacitively coupled to the base electrode of the transistor 90. In the alternative, the variable resistance element of FIGURE 3*a*, is employed and the emitter electrode of the transistor 112 is connected to the base electrode of transistor 90 through the coupling capacitor 96. The collector electrode of the transistor 112 is ground referenced while the base electrode is connected through a resistor 114 to a terminal 116 provided to receive a control signal.

As will be readily apparent to those skilled in the art, a wide variety of different systems may be designed and produced in accordance with the present invention. Furthermore, the values of individual components in such systems may also vary considerably. Within such a broad range of possible designs, one specific form of the present invention which has been found to function effectively is that shown in FIGURES 3 and 3*a* implemented with components of values indicated in the following chart designed to operate between a frequency range of 100 c.p.s. to 1 mc.

| Component: | Value |
|---|---|
| Resistor— | |
| 80 | 10K |
| 86 | 10K |
| 82 | 22K |
| 96 | 10K |
| 104 | 10K |
| 114 | 10K |
| Capacitor— | |
| 76 | mf__ 0.1 |
| 103 | mf__ 0.1 |
| 98 | mf__ 10 |
| Transistor— | |
| 84 | 2N3251 |
| 90 | 2N2484 |
| 112 | 2N1996 |
| Diodes 106 and 108 | 1N663 |

In the operation of the system as shown in FIGURE 3, the transistor 84 provides a constant-current bias for the transistor 90 through emitter current degeneration by the resistor 86, thereby providing a high-impedance signal drive for the substantially-linear amplifier embodied by the transistor 90. Of course, as previously, the transistor 90 is operated on a substantially linear portion of its characteristic curve so as to accomplish linear operation of a system over a wide range. The feedback control for the transistor 90 is provided through a resistor 96 and the parallel circuit including the Zener-diode 92 and the capacitor 94. The diode 92 in this application provides a stable collector-base bias voltage across the transistor 90 while the resistor 96 functions in cooperation with one or the other of the variable resistance element circuits 68 or 70 to accomplish variable attenuation of the input signal to the amplifier 72.

The variable resistance element of FIGURE 3*a* includes the transistor 112 which is operated in the inverted mode as a variable resistor whose resistance is a function of the direct current control voltage at terminal 116. The signal voltage at terminal 117 is kept at low levels to achieve low-distortion linear operation as discussed in conjunction with the implementation of FIGURE 1. Of course, variable resistance elements of this type are well known in the prior art and widely used simply as the shunt leg in prior variable attenuator circuits.

The variable resistance element 70 includes interconnected diodes 106 and 108 which are biased by the control signal applied through the conductor 102 from the rectified output of the amplifier 72. The midpoint between the diodes is therefore presented with a variable resistance to ground, depending upon the voltage level established at the terminal 109. The variable resistance to ground depends on the parallel combination of the dynamic impedances represented by the forward characteristics of the diodes 106 and 108. Since the present invention allows the diodes to operate at very low signal levels, linear and substantially distortion free performances can be achieved.

As indicated above, circuits incorporating the present invention are capable of operating directly on relatively high signal levels with low distortion characteristics. Specifically, for example, variable gain ranges up to 40 db using a diode variable resistance element, and 0.0 dbv operation with less than 1% distortion using a transistor variable resistance element normally restricted to −40 dbv operation at 1% distortion, are practical in relatively unsophisticated embodiments of the present invention. Furthermore, the system may be embodied in compact circuits or integrated circuits using only resistor and semiconductor and eliminating the coupling capacitors by direct coupling techniques.

What is claimed is:

1. A circuit for variously attenuating an input signal in accordance with an input control signal comprising:

a substantially-linear amplifier having a controlled current path, said amplifier being connected to receive an attenuating-component portion of said input signal;

means connected in parallel with said substantially-linear amplifier for receiving another portion of said input signal;

a current divider including an ohmic input to said substantially-linear amplifier, and a variable resistance element; means for coupling said input control signal to said variable resistance element;

means coupling said current divider to said substantially-linear amplifier for providing an amplifier control signal to control said substantially-linear amplifier.

2. A circuit in accordance with claim 1 wherein said input includes a reference diode to provide a stabilized voltage to said substantially linear amplifier.

3. A circuit in accordance with claim 1 wherein said variable resistance element includes diode means and said substantially-linear amplifier includes a transistor.

4. A circuit in accordance with claim 1 wherein said variable resistance element includes transistor means.

5. A circuit according to claim 1 further including a current amplifier connected to operate on said input signal prior application thereof to said circuit as defined in claim 2.

6. A circuit according to claim 1 further including an output amplifier connected to receive still one other portion of said input signal and having an output connected to provide said input control signal.

References Cited

UNITED STATES PATENTS

| | | | |
|---|---|---|---|
| 2,873,387 | 2/1959 | Kidd | 307—88.5 |
| 3,229,218 | 1/1966 | Sickles et al. | 330—145 X |
| 3,231,755 | 1/1966 | Pascal | 330—29 X |
| 3,268,828 | 8/1966 | Mollinga | 330—29 X |

FOREIGN PATENTS

| | | |
|---|---|---|
| 952,904 | 3/1964 | Great Britain. |

ROY LAKE, *Primary Examiner.*

JAMES B. MULLINS, *Assistant Examiner.*